United States Patent
Nobayashi

(10) Patent No.: US 8,669,559 B2
(45) Date of Patent: Mar. 11, 2014

(54) IMAGE DISPLAY APPARATUS AND IMAGE DISPLAY APPARATUS MANUFACTURING METHOD

(75) Inventor: Kazuya Nobayashi, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/583,050

(22) PCT Filed: Apr. 7, 2011

(86) PCT No.: PCT/JP2011/059222
§ 371 (c)(1),
(2), (4) Date: Sep. 6, 2012

(87) PCT Pub. No.: WO2011/129381
PCT Pub. Date: Oct. 20, 2011

(65) Prior Publication Data
US 2012/0326182 A1  Dec. 27, 2012

(30) Foreign Application Priority Data

Apr. 12, 2010 (JP) .................................. 2010-091594

(51) Int. Cl.
*H01L 29/15* (2006.01)
(52) U.S. Cl.
USPC .......................................................... 257/72
(58) Field of Classification Search
USPC ............ 257/88, E33.073; 313/502–506, 110; 438/34, 35, 22
See application file for complete search history.

(56) References Cited

U.S. PATENT DOCUMENTS 6,476,550 B1  11/2002  Oda et al.
7,612,827 B2  11/2009  Tanaka
(Continued)

FOREIGN PATENT DOCUMENTS

JP  2991183 B2  12/1999
JP  2002-090512 A  3/2002
(Continued)

OTHER PUBLICATIONS

Notification Concerning Transmittal of International Preliminary Report on Patentability and Written Opinion of the International Searching Authority dated Oct. 26, 2012, in related PCT/JP2011/059222.

(Continued)

*Primary Examiner* — Yu-Hsi D Sun
*Assistant Examiner* — Christina Sylvia
(74) *Attorney, Agent, or Firm* — Fitzpatrick, Cella, Harper & Scinto

(57) ABSTRACT

Provided is an image display apparatus in which color breakup of a reflection image formed from reflected ambient light may be reduced to suppress the influence of an ambient environment. The image display apparatus includes multiple pixels. Each of the pixels includes a light-emitting layer and a structure layer having a refractive index distribution in an in-plane direction parallel to a screen of the image display apparatus, for extracting light generated from the light-emitting layer. The structure layer includes multiple structures formed of a first medium and a layer formed of a second medium having a refractive index different from a refractive index of the first medium. The multiple structures are non-periodically arranged in the layer. Reflected ambient light is reflected by the multiple structures formed of the first medium to have an overlap range to reduce color breakup of a reflection image formed from the reflected ambient light.

11 Claims, 13 Drawing Sheets

(56) References Cited

U.S. PATENT DOCUMENTS

| | | | |
|---|---|---|---|
| 8,283,857 B2* | 10/2012 | Ikemoto | 313/506 |
| 2002/0180348 A1 | 12/2002 | Oda et al. | |
| 2004/0032659 A1* | 2/2004 | Drinkwater | 359/558 |
| 2006/0083148 A1 | 4/2006 | Yokoyama | |
| 2006/0215057 A1 | 9/2006 | Tanaka | |
| 2010/0046236 A1 | 2/2010 | Nishiwaki | |

FOREIGN PATENT DOCUMENTS

| | | |
|---|---|---|
| JP | 2002-352956 A | 12/2002 |
| JP | 2006-093019 A | 4/2006 |
| JP | 2006-114432 A | 4/2006 |
| JP | 2006-253956 A | 9/2006 |
| JP | 2005-276581 A | 10/2006 |
| JP | 4186688 A | 11/2008 |
| WO | 2009/063636 A1 | 5/2009 |

OTHER PUBLICATIONS

Notification of Transmittal of the International Search Report and the Written Opinion of the International Searching Authority, the International Search Report, and the Written Opinion of the International Searching Authority dated Jun. 7, 2011.

* cited by examiner

SMALL INTENSITY — LARGE INTENSITY

SMALL INTENSITY — LARGE INTENSITY

IMAGE DISPLAY APPARATUS AND IMAGE DISPLAY APPARATUS MANUFACTURING METHOD

TECHNICAL FIELD

The present invention relates to an image display apparatus and a manufacturing method suitable for the image display apparatus.

BACKGROUND ART

Up to now, image display apparatuses having various structures have been proposed. FIG. 14 is a structural cross sectional view illustrating an example of one of the image display apparatuses which have been known.

In FIG. 14, an image display apparatus 1400 includes multiple pixel structures each having a pixel 1402.

In the image display apparatus 1400, the pixel 1402 is provided on an inner surface side of a front plate 1401. The front plate 1401 is made of a medium transparent to visible light, for example, glass or plastic.

The pixel 1402 includes a light-emitting layer 1403 and an excitation unit (not shown) for exciting the light-emitting layer 1403.

The excitation unit has, for example, a structure in which an electron emitting element and an electrode are arranged on a substrate and an electrode is provided between the front plate 1401 and the light-emitting layer 1403. In such a structure, an electric field is applied to the electron emitting element to emit electrons. The electrons are injected into the light-emitting layer to generate light in the light-emitting layer.

Another example of the excitation unit has a structure in which an anode and a cathode are provided on a front surface and a rear surface of the light-emitting layer. Light generated in the light-emitting layer passes through the front plate 1401 and is extracted to an outside to serve as display light 1405.

The image display apparatus is required to be high in contrast and less influenced by an ambient environment. In order to improve the contrast of the image display apparatus in bright light, it is necessary to increase display luminance.

In order to increase the luminance of the display light in the image display apparatus 1400, it is important to reduce a loss occurring while the light generated in the light-emitting layer 1403 is extracted to the outside.

One of factors of the loss is a total-reflection loss at an interface between the light-emitting layer 1403 and the front plate 1401 or an interface between the front plate 1401 and an outside region.

When light propagates from a high-refractive index medium (light-emitting layer 1403 or front plate 1401) to a low-refractive index medium (outside region), light propagating at an angle larger than a critical angle is totally reflected and confined in the high-refractive index medium.

The totally reflected light is not extracted to the low-refractive index medium and propagates through the high-refractive index medium, to thereby cause the loss.

A method of providing a fine structure between layers made of media having different refractive indices has been proposed as a method of reducing the total-reflection loss to increase the luminance of the display light.

For example, an image display apparatus (organic electroluminescence display apparatus) illustrated in FIG. 15 is described in PTL 1.

An image display apparatus 1500 illustrated in FIG. 15 includes a front plate 1501, a transparent electrode 1502, a light-emitting layer 1503, and an electrode layer 1504. A fine structure 1505 is provided between the front plate 1501 and the light-emitting layer 1503.

The fine structure 1505 has a refractive index distribution having a period equal to a wavelength of light in a plane parallel to the front plate.

Light 1509 generated in an inner portion of the light-emitting layer 1503 is diffracted to reduce light 1511 propagating at an angle equal to or larger than a critical angle, to thereby increase light 1510 propagating at an angle smaller than the critical angle. Therefore, the light extracted to the outside is increased to improve the display luminance.

CITATION LIST

Patent Literature

PTL 1: Japanese Patent No. 2991183

SUMMARY OF INVENTION

Technical Problem

The image display apparatus which is conventionally proposed and described in PTL 1 has a problem that, when light entering the image display apparatus from the outside is reflected on the fine structure, a reflection angle of the reflected light (hereinafter, referred to as reflected ambient light) changes depending on wavelength and thus the color breakup of a reflection image occurs.

In the case of PTL 1, the fine structure 1505 having the periodic interval equal to the wavelength of the light is used.

When ambient light 1506 having a wavelength-1 and a wavelength-2 enters the fine structure 1505 as described above, reflected diffraction light is generated by the fine structure 1505.

A reflection angle of the reflected diffraction light is determined based on the periodic internal of the fine structure 1505 and the wavelength of the light.

Therefore, ambient light having the wavelength-1 is reflected as reflected ambient light 1507 in a traveling direction thereof and ambient light having the wavelength-2 is reflected as reflected ambient light 1508 in a traveling direction thereof.

As a result, the reflected ambient light 1507 and the reflected ambient light 1508 are reflected in the different traveling directions.

When the image display apparatus is used in bright light, ambient light from an ambient environment enters the image display apparatus.

In a normal ambient environment in which the image display apparatus is used, the ambient light has multiple wavelengths as in the case of white light.

The reflection angle changes depending on wavelength, and hence the reflected ambient light is reflected in the direction changed depending on wavelength.

As a result, the color breakup of the reflection image formed from the reflected ambient light occurs. When the image display apparatus as described above is viewed, the color of the reflection image formed from the reflected ambient light changes with a change in viewing position, and hence the display quality of the image display apparatus significantly degrades.

Thus, an image display apparatus is desired, which is capable of reducing the color breakup of the reflection image formed from the reflected ambient light while high display luminance of the image display apparatus is maintained.

The present invention has been made in view of the problem described above. It is an object of the present invention to provide an image display apparatus which is capable of reducing the color breakup of the reflection image formed from the reflected ambient light to suppress the influence of the ambient environment, and a method of manufacturing the image display apparatus.

Solution to Problem

According to the present invention, an image display apparatus includes multiple pixels. Each of the pixels includes a light-emitting layer and a structure layer for extracting light generated from the light-emitting layer. The structure layer has a structure in which multiple structures made of a first medium are non-periodically arranged in a layer made of a second medium different in refractive index from the first medium and a refractive index distribution is provided in an in-plane direction parallel to a screen of the image display apparatus. Reflected ambient light is reflected by the structure layer in which the multiple structures are non-periodically arranged to have an overlap range, thereby reducing color breakup of a reflection image formed from the reflected ambient light.

Further, the present invention is an image display apparatus manufacturing method of manufacturing the image display apparatus according to any one of claims 1 to 10 includes: dispersing minutes balls on a substrate at a number density P [1/m$^2$] to form a fine particle layer, and the number density P satisfies the following relational expression:

$$\frac{2}{9\sqrt{3}}10^{12} < P < \frac{2}{\sqrt{3}}10^{12}.$$

Advantageous Effects of Invention

According to the present invention, it is possible to realize an image display apparatus which is capable of reducing the color breakup of the reflection image formed from the reflected ambient light to suppress the influence of the ambient environment, and a method of manufacturing the image display apparatus.

DESCRIPTION OF EMBODIMENT

A structure of an image display apparatus according to an embodiment of the present invention is described with reference to FIG. 1.

Figure 1:
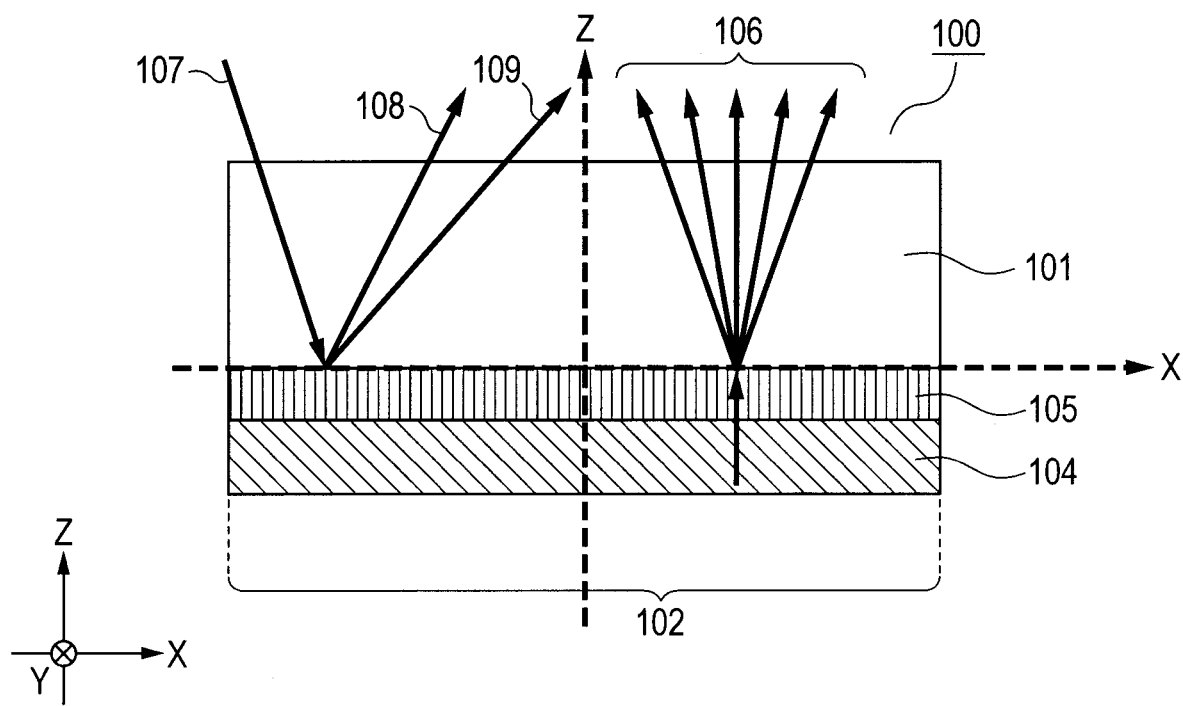
FIG. 1 illustrates an image display apparatus according to an embodiment of the present invention.

FIG. 1 is an xz-cross sectional view illustrating an image display apparatus 100 according to this embodiment.

The image display apparatus 100 according to this embodiment includes a front plate 101 through which light may pass and a pixel 102. The pixel 102 is provided on a rear surface of the front plate 101.

FIG. 1 illustrates a single pixel 102. Multiple pixels each being the pixel 102 are arranged in the image display apparatus 100.

The respective pixels 102 are separated by a black matrix made of a medium having a light absorption property.

The front plate 101 is made of a medium transparent to visible light. For example, glass may be used.

The pixel 102 includes a light-emitting layer 104, a fine structure layer 105, and an excitation unit (not shown). The fine structure layer 105 is provided between the front plate 101 and the light-emitting layer 104.

The light-emitting layer 104 is, for example, a film containing a phosphor and generates light having any wavelength in a range of 350 nm to 800 nm.

The fine structure layer 105 is made of at least two kinds of media having different refractive indices and serves as a refractive index distribution structure layer having a refractive index distribution in an xy-plane parallel to the front plate which is in an in-plane direction parallel to a screen of the image display apparatus.

An example of the fine structure layer 105 in this embodiment is described with reference to FIGS. 2A and 2B.

Figure 2A:
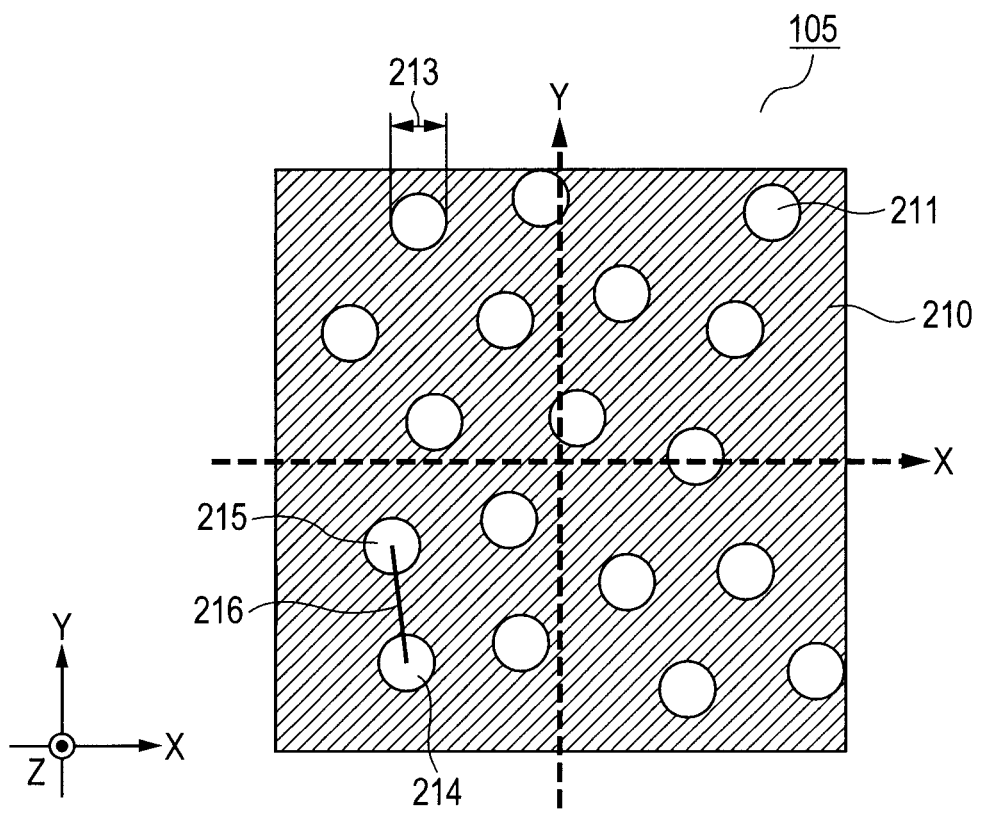
FIGS. 2A and 2B illustrate a fine structure provided in the image display apparatus according to the embodiment of the present invention.
Figure 2B:
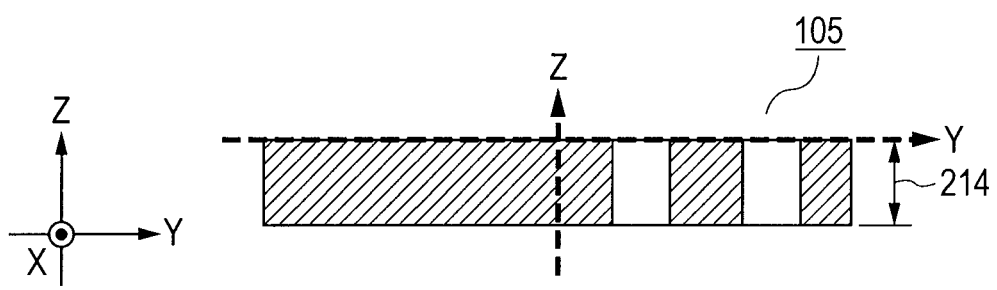

FIGS. 2A and 2B are xy- and yz-plane views illustrating the fine structure layer 105.

The fine structure layer 105 includes cylindrical structures 211 made of a first medium and a layer 210 made of a second medium.

The cylindrical structures 211 are non-periodically arranged in an xy-plane of the layer 210.

In the following description, a distance between the centers of gravity of adjacent two of the cylindrical structures is referred to as a distance between center of gravity. For example, in FIG. 2A, a length of a line 216 joining the center of gravity of a cylindrical structure 214 with the center of gravity of a cylindrical structure 215 is the distance between center of gravity.

An arithmetic mean value of distances between center of gravity is referred to as an average distance between center of gravity. A distance between center of gravity occurring with a maximum frequency in a distribution of a distance between center of gravity is referred to as a most frequent distance between center of gravity. The positive square root of the sample variance of a distance between center of gravity is referred to as a variation of distance between center of gravity.

The excitation unit includes a unit for injecting electrons into the light-emitting layer 104.

The excitation unit has, for example, a structure in which an electron emitting element and an electrode are arranged on a substrate and an electrode is provided on a surface of the light-emitting layer 104.

In such structure, when an electric field is applied to the electron emitting element, electrons are supplied to the light-emitting layer 104 to generate light.

The generated light passes through the fine structure layer 105 and the front plate 101 and is extracted to the outside, and thus becomes display light 106 propagating in a +z-direction.

In the present invention, a direction in which the display light 106 exits is defined as a light exit side.

Next, a principle with which an influence of an ambient environment may be reduced in the image display apparatus 100 according to this embodiment is described.

When light enters the image display apparatus 100 from the outside, the light passes through an interface between an outside region and the front plate and reaches the fine structure layer 105.

The light reaching the fine structure layer 105 is diffracted by the fine structure layer 105 having a refractive index distribution and divided into multiple diffraction light beams.

Of the diffraction light beams, a light beam traveling in the +z-direction is referred to as reflected diffraction light and a light beam traveling in a −z-direction is referred to as transmitted diffraction light.

A part of the reflected diffraction light which propagates at an angle smaller than a critical angle in the interface between the front plate 101 and the outside region exits as reflected ambient light to the outside.

Figure 3A:
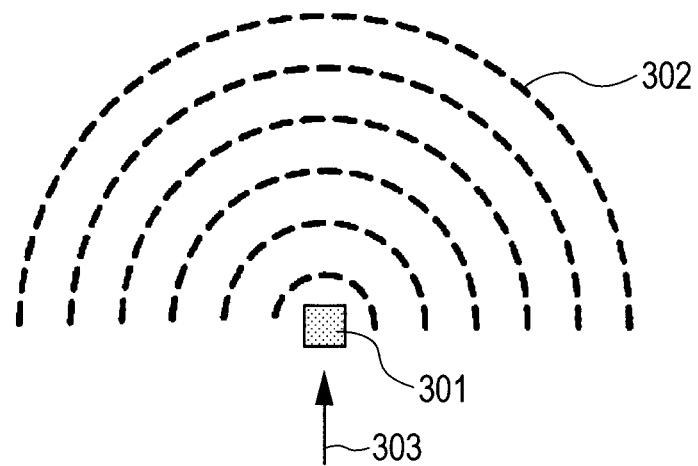
FIGS. 3A and 3B are schematic diagrams illustrating a diffraction angle in the embodiment of the present invention.
Figure 3B:
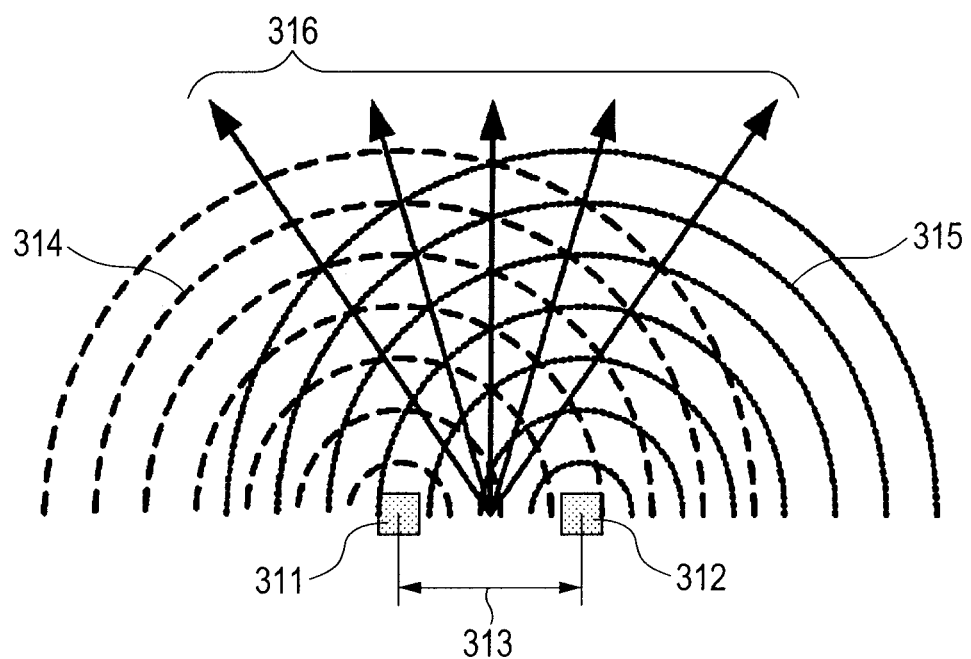

FIGS. 3A and 3B are schematic diagrams illustrating diffraction waves in a case where a structure different in refractive index from an ambience is provided. In FIGS. 3A and 3B, wavefronts of light are exhibited by broken lines and dot lines.

As illustrated in FIG. 3A, when a single structure 301 is provided, incident light 303 is diffracted by the structure 301 to generate a single diffraction wave 302.

As illustrated in FIG. 3B, when multiple structures are provided, single diffraction light 314 generated by the structure 311 and single diffraction light 315 generated by the structure 312 interfere with each other. Therefore, the single diffraction light 314 and the single diffraction light 315 are strengthened in positions in which the wavefronts thereof overlap with each other, to thereby generate diffraction light 316.

Thus, a reflection angle of the diffraction light 316 is determined based on a distance 313 between the structure 311 and the structure 312 and a wavelength of the incident light.

The fine structure layer 105 used in this embodiment includes the non-periodical arrangement having various distances between center of gravity.

When light enters the fine structure layer 105, diffraction light having a diffraction angle determined based on each of the distances between center of gravity generates.

When the frequency of the distance between center of gravity becomes higher in the distribution of distance between center of gravity, the number of overlapped single diffraction light beams becomes larger, and hence a diffraction light intensity increases. Therefore, the diffraction light intensity at each reflection angle depends on the frequency distribution of distance between center of gravity.

Thus, an angle distribution width of the diffraction light generated in the fine structure layer 105 used in this embodiment corresponds to a variation of distance between center of gravity σ.

FIG. 1 illustrates a propagation state of reflected diffraction light generated in the fine structure layer 105 in a case where ambient light 107 enters the fine structure layer 105 used in this embodiment. When the ambient light 107 enters the fine structure layer 105, the ambient light 107 is reflected at an angle determined based on the distribution of distance between center of gravity of the fine structure layer 105 and a wavelength of the ambient light 107.

In FIG. 1, reflected ambient light beams having different wavelengths are illustrated as reflected ambient light beams 108 and 109.

Figure 4:
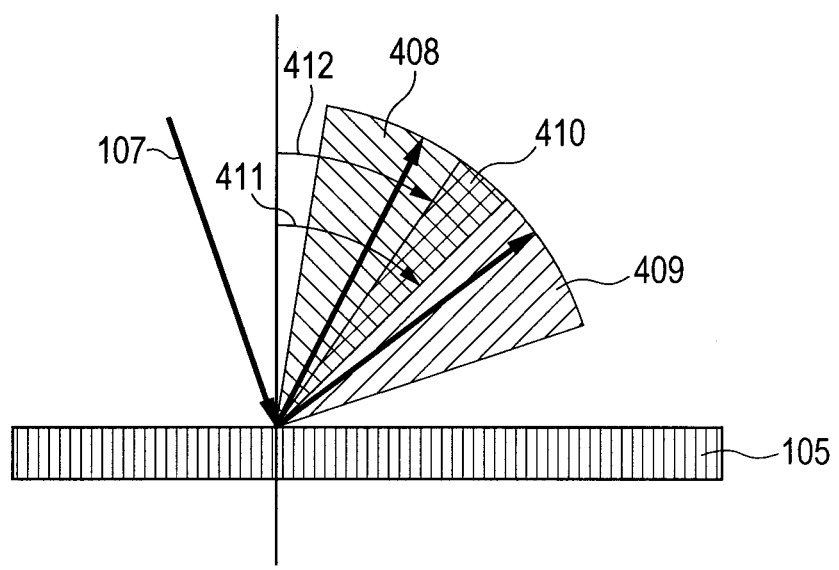
FIG. 4 illustrates a propagation state of reflected ambient light in the image display apparatus according to the embodiment of the present invention.

The fine structure layer 105 has the non-periodical arrangement, and hence each of the reflected ambient light beams 108 and 109 has an angle distribution depending on the variation of distance between center of gravity as illustrated in FIG. 4.

Each of the reflected ambient light beams has the reflection angle distribution, and hence an overlap area is generated between the reflected ambient light beams having the different wavelengths.

In FIG. 4, the angle distribution of the reflected ambient light beam 108 is exhibited by a hatched area 408, the angle distribution of the reflected ambient light beam 109 is exhibited by a hatched area 409, and an overlap area between the hatched area 408 and the hatched area 409 is exhibited as a cross-hatched area 410. In FIG. 4, the front plate, the light-emitting layer, and the excitation unit are not illustrated.

As described above, there is the overlap area 410 between the angle distribution area (hatched area) 408 of the reflected ambient light beam 108 and the angle distribution area (hatched area) 409 of the reflected ambient light beam 109, and hence the color breakup of a reflection image formed by the reflected ambient light beams is reduced.

Figure 5A:
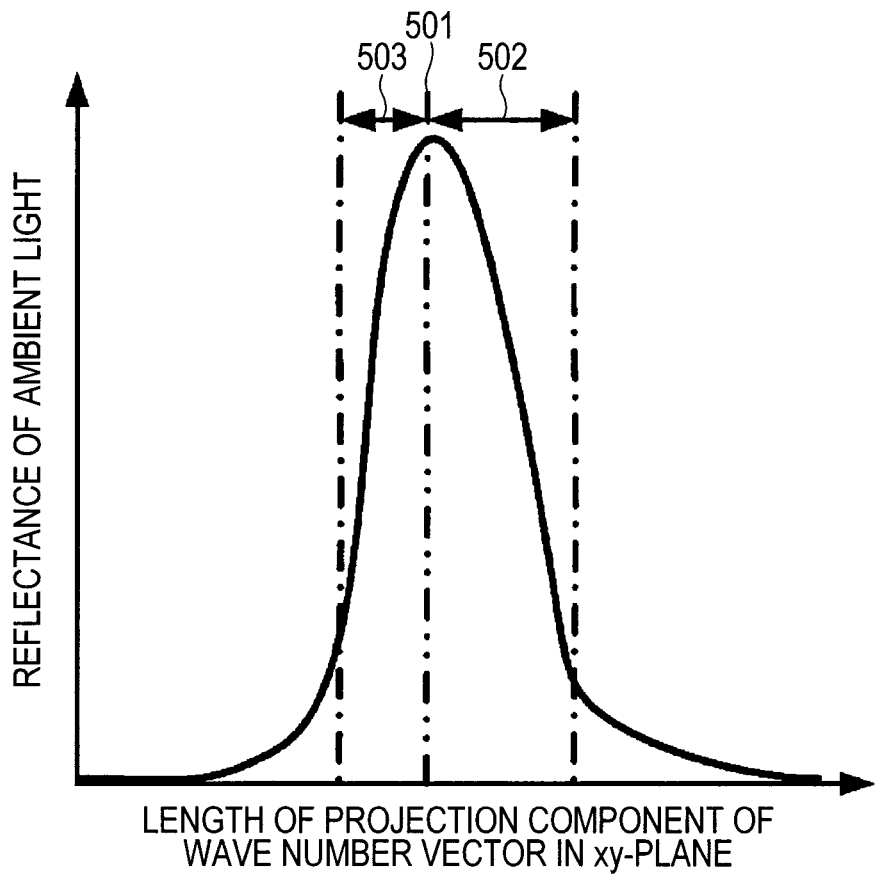
FIGS. 5A and 5B illustrate the reflected ambient light in the image display apparatus according to the embodiment of the present invention.

FIG. 5A illustrates a reflectance of ambient light by a solid line in a case where the ambient light enters the image display apparatus 100 according to this embodiment.

In FIG. 5A, the abscissa indicates a length of a component obtained by projecting a wave number vector of reflected ambient light to an xy-plane and the ordinate indicates a reflectance of ambient light.

Figure 5B:
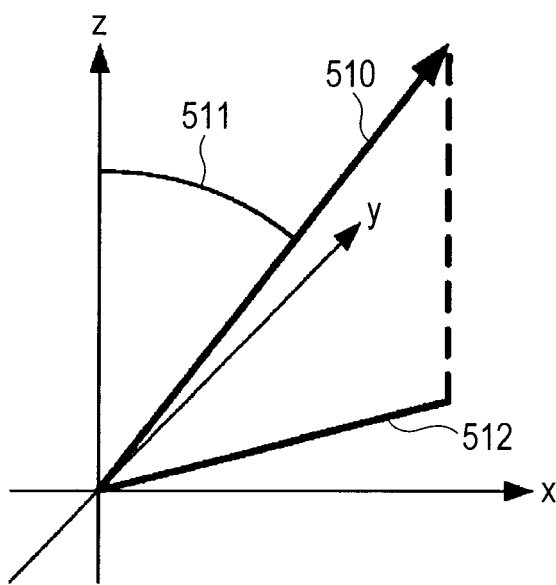

FIG. 5B illustrates a wave number vector 510 of the reflected ambient light, a reflection angle 511 of the reflected ambient light relative to the z-axis, and a length 512 of the component obtained by projecting the wave number vector of the reflected ambient light to the xy-plane. The reflection angle 511 and the length 512 have the following relationship.

(Reflection angle 511)=arcsin {(length 512)/(length of wave number vector 510 of reflected ambient light)}

Hereinafter, the length 512 is represented by k1. In addition, the length of the component obtained by projecting the wave number vector of the incident light to the xy-plane is represented by kinxy. Further, the length ($2\pi/L\max$) of a most frequent distance between center of gravity Lmax in a reciprocal lattice space in which a large number of single diffraction light beams overlap with one another is represented by G1.

In FIG. 5A, a position of k1 is exhibited by a chain double-dashed line 501.

The reflected ambient light has a peak ambient light reflectance value at k1 (=kinxy+G1). The component obtained by projecting the wave number vector of the reflected ambient light to the xy-plane has a distribution width because of the overlap of single diffraction light beams in various distances between center of gravity.

When a wave number distribution width 502 is represented by Δ1 and a wave number distribution width 503 is represented by Δ2, the wave number distribution widths may be expressed by the following expressions based on the variation σ of distance between center of gravity relative to an average distance between center of gravity L.

$$\Delta 1 = \{2\pi/(L-\sigma) - 2\pi/L\}$$

$$\Delta 2 = \{2\pi/L - 2\pi/(L+\sigma)\}$$

The reflected ambient light has a wave number distribution width between (k1−Δ2) and (k1+Δ1) with respect to k1. The corresponding angle distribution width is a difference between a reflection angle obtained from (k1+Δ1) and a reflection angle obtained from (k1−Δ2).

Assume that θ1 represents a maximum reflection angle (exhibited by reference numeral 411 of FIG. 4) in a reflection angle distribution range of ambient light having a wavelength λ1.

Assume that θ2 represents a minimum reflection angle (exhibited by reference numeral 412 of FIG. 4) in a reflection angle distribution range of ambient light having a wavelength λ2. In this case, the reflection angles θ1 and θ2 are expressed by Expression 1.

$$\theta 1 = \arcsin\left(\frac{k1_{\lambda 1} + \Delta 1}{k_{\lambda 1}}\right) \qquad \text{Expression 1}$$

$$\theta 2 = \arcsin\left(\frac{k1_{\lambda 2} - \Delta 2}{k_{\lambda 2}}\right)$$

In Expression 1, k represents a wave number vector length and numerical subscripts λ1 and λ2 of k represent the wavelengths of light. Similarly, numerical subscripts λ1 and λ2 of k1 represent the wavelengths of light.

When θ1>θ2 is satisfied, that is, when Expression 2 described below is satisfied, reflection angle ranges of reflected ambient light beams having a wavelength range between the wavelengths λ1 and λ2 overlap with each other, and hence the color breakup of a reflection image formed by the reflected ambient light beams in the fine structure layer 105 may be reduced.

$$\frac{\lambda_2 - \lambda_1}{\lambda_2 + \lambda_1} < \frac{\sigma/L}{1 + (1 - (\sigma/L)^2)(L/L_{max} - 1)} \qquad \text{Expression 2}$$

In order to reduce the dependence of reflected ambient light on wavelength, it is desired that reflection angle ranges of reflected ambient light beams of at least two of three colors of red, green, and blue should overlap with each other.

When Expression 3 described below is satisfied, reflection angle ranges of reflected ambient light beams having a wavelength in a range of 530 nm (λ1) to 650 nm (λ2) overlap with each other.

Reflection angle ranges of reflected ambient light beams having a wavelength in a range of 440 nm (λ1) to 540 nm (λ2) also overlap with each other.

$$0.10 < \frac{\sigma/L}{1 + (1 - (\sigma/L)^2)(L/L_{max} - 1)} \qquad \text{Expression 3}$$

The fine structure layer 105 as described above is provided between the front plate 101 and the light-emitting layer 104, and hence the reflection angle ranges of the reflected ambient light beams of at least two of the three colors of red, green, and blue overlap with each other. Therefore, the color breakup of the reflection image formed by the reflected ambient light beams is reduced.

More desirably, when Expression 4 described below is satisfied, reflection angle ranges of reflected ambient light beams having a wavelength in a visible light range of 400 nm (λ1) to 700 nm (λ2) overlap with each other, and hence the color breakup of a reflection image formed by reflected ambient light beams of the three colors of red, green, and blue is reduced.

$$0.27 < \frac{\sigma/L}{1 + (1 - (\sigma/L)^2)(L/L_{max} - 1)} \qquad \text{Expression 4}$$

With the fine structure layer 105 provided for the numerical ranges described above, the reflection angle ranges of the reflected ambient light beams overlap with each other, and hence an image display apparatus may be obtained in which the color breakup of the reflection image formed by the reflected ambient light beams is reduced. As a result, an image display apparatus in which the influence of an ambient environment is small may be obtained.

A diffraction phenomenon of light occurs depending on a difference between a reflectance of light entering the first medium and a reflectance of light entering the second medium and a phase difference between the light propagating through the first medium and the light propagating through the second medium.

Therefore, the cylindrical structures 211 are non-periodically arranged in the fine structure layer 105. Even when polygonal columnar structures each having a circumcircle with a radius r in cross sectional shape in the xy-plane are non-periodically arranged, the effects of the present invention are not lost.

In this embodiment, when the cylindrical structures each having a radius r are arranged in the fine structure layer 105 in the average distance between center of gravity L and the most frequent distance between center of gravity Lmax, an upper limit of the variation σ of distance between center of gravity may be expressed by Expression 5 described below.

$$\frac{\sigma/L}{1 + (1 - (\sigma/L)^2)(L/L_{max} - 1)} < \frac{1 - 2r/L}{1 + 2r/L(1 - 2r/L)} \qquad \text{Expression 5}$$

Figure 9:
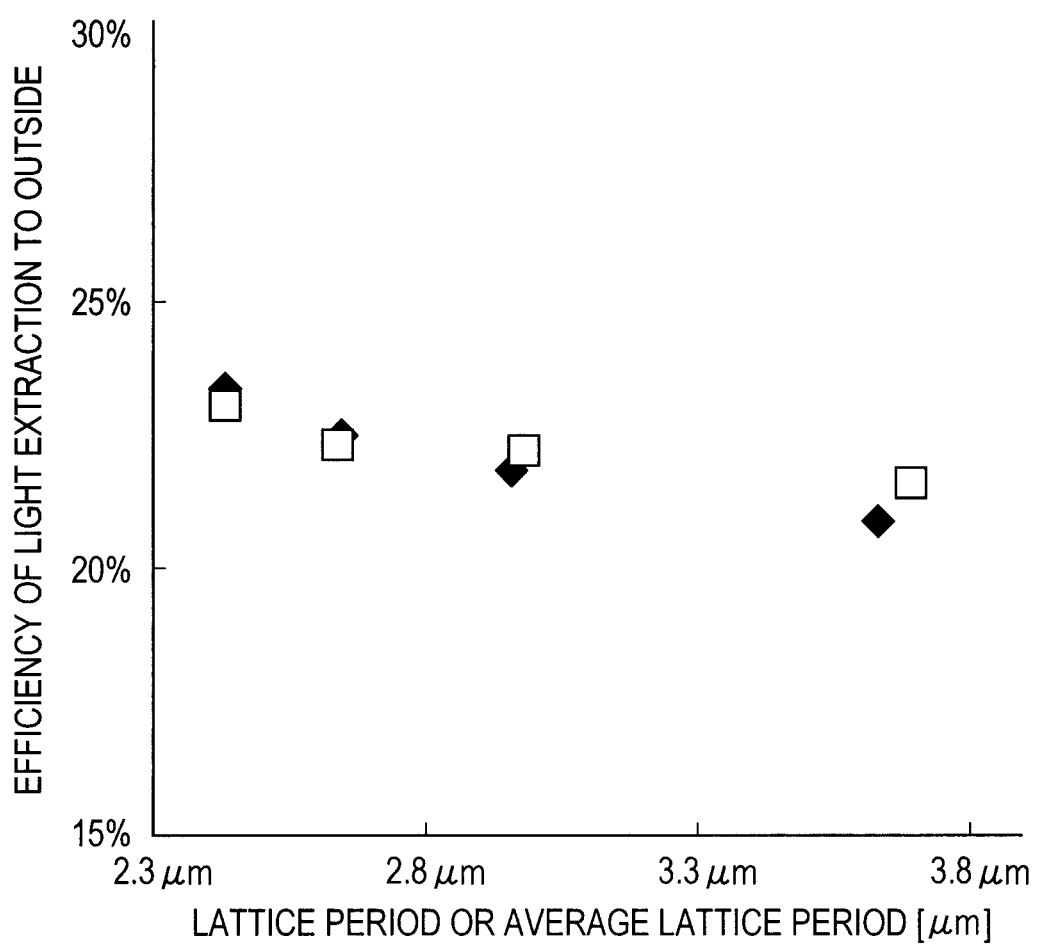
FIG. 9 illustrates efficiencies of light extraction from a light-emitting layer to an outside in the image display apparatus according to the embodiment of the present invention and an image display apparatus in which a periodic fine structure is provided.

FIG. 9 illustrates an efficiency of extracting light emitted from the light-emitting layer to the outside. In FIG. 9, the efficiency in a case of the image display apparatus in which the fine structure layer 105 of the present invention is provided is indicated by black rhombus marks, and the efficiency in a case of an image display apparatus in which a fine structure having a periodic lattice point arrangement (hereinafter, referred to as periodic fine structure) is provided is indicated by white square marks.

With respect to the fine structure layer 105 in this embodiment, the abscissa indicates the average distance between center of gravity. With respect to the image display apparatus in which the periodic fine structure is provided, the abscissa indicates a lattice constant. As illustrated in FIG. 9, the image display apparatus in which the fine structure layer of the present invention is provided and the image display apparatus in which the periodic fine structure is provided have the same light extraction efficiency.

That is, the fine structure layer 105 provided in the image display apparatus according to this embodiment is designed such that the cylindrical structure radius and the average distance between center of gravity are equal to a cylindrical structure radius and a lattice constant, respectively, which are capable of obtaining high light extraction efficiency in the periodic fine structure. Therefore, an image display apparatus having high light extraction efficiency may be obtained.

Figure 10:
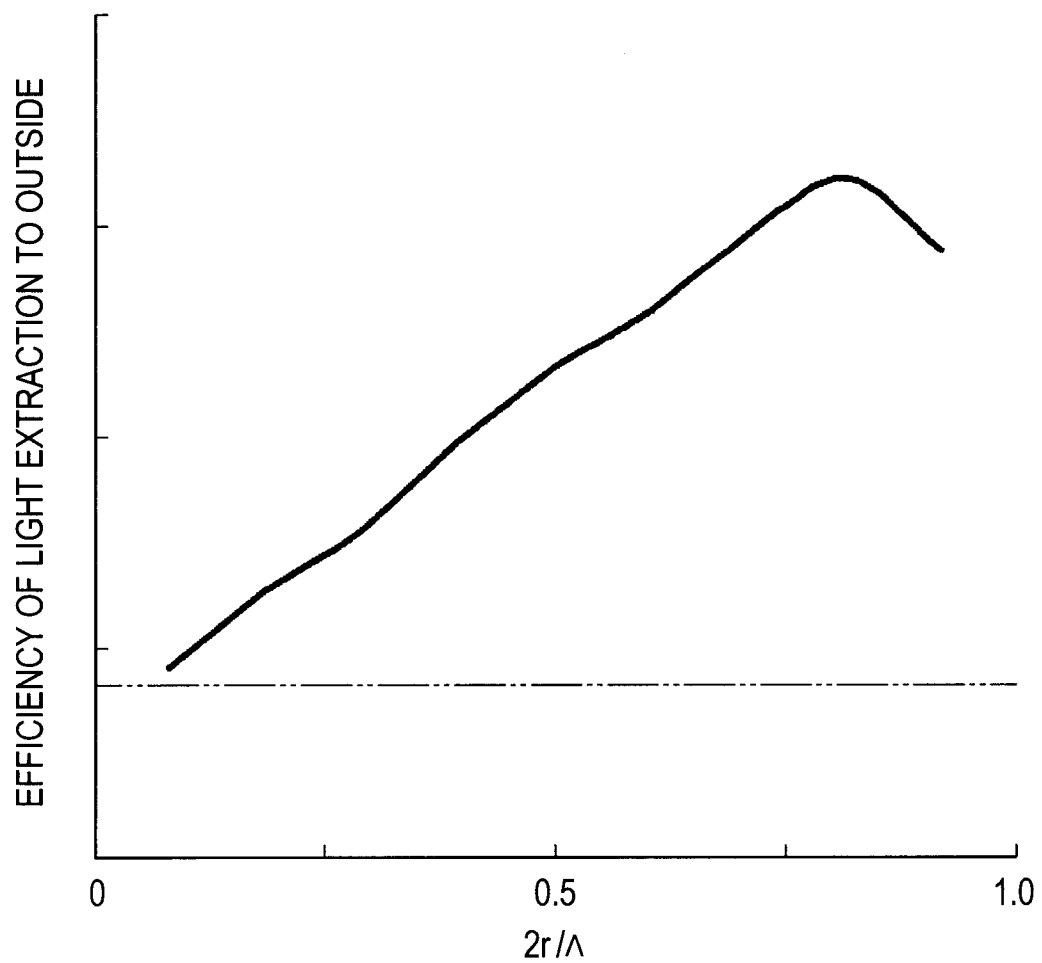
FIG. 10 illustrates an efficiency of light extraction from a light-emitting layer to the outside in the image display apparatus using the periodic fine structure in the embodiment of the present invention.

FIG. 10 illustrates the light extraction efficiency of the image display apparatus using the periodic fine structure.

In FIG. 10, a chain double-dashed line exhibits the efficiency of light extraction to the outside of an image display apparatus in which the fine structure is not provided. The abscissa indicates a value $(2r/\Lambda)$ obtained by dividing a cylindrical structure diameter by a lattice constant $\Lambda$.

When the value $(2r/\Lambda)$ is set to a value larger than 0.1, the efficiency of light extraction to the outside may be improved as compared with the case where the periodic fine structure is not provided.

More desirably, when the value $(2r/\Lambda)$ is set to a value larger than 0.3, light may be extracted to the outside with an efficiency of two times as compared with the case where the periodic fine structure is not provided.

Therefore, even in the case of the fine structure layer 105 of the present invention, when a value $(2r/L)$ obtained by dividing the cylindrical structure diameter by the average distance between center of gravity is set to a value larger than 0.1, high light extraction efficiency may be obtained.

Thus, when the fine structure layer 105 provided in the image display apparatus according to this embodiment satisfies Expression 6, the efficiency of light extraction to the outside may be improved.

$$\frac{\sigma/L}{1+(1-(\sigma/L)^2)(L/L_{max}-1)} < 0.83 \qquad \text{Expression 6}$$

More desirably, when the value $(2r/L)$ is set to a value larger than 0.3, higher light extraction efficiency may be obtained.

Thus, when the fine structure layer 105 provided in the image display apparatus according to this embodiment satisfies Expression 7, the efficiency of light extraction to the outside may be further improved.

$$\frac{\sigma/L}{1+(1-(\sigma/L)^2)(L/L_{max}-1)} < 0.58 \qquad \text{Expression 7}$$

The efficiency of light extraction to the outside is improved, and hence the display luminance of the image display apparatus may be increased. Therefore, an image display apparatus having a high contrast may be obtained.

In order to improve the efficiency of light extraction to the outside, it is necessary to reduce light propagating at an angle equal to or larger than the critical angle by diffraction.

In order to obtain a higher effect of improving the efficiency of light extraction to the outside, it is desired that the fine structure layer 105 have the second- or higher-order diffraction light. When light enters the fine structure, light of a diffraction order which satisfies Expression 8 described below generates.

$$N_{in} \sin \theta_{in} + m\lambda/\Lambda < N_{out} \qquad \text{Expression 8}$$

In Expression 8, $\lambda$ indicates a wavelength of incident light, Nin indicates a refractive index of a region through which the incident light propagates, and Nout indicates a refractive index of a region through which the reflected diffraction light or transmitted diffraction light propagates. In addition, $\theta$in indicates an angle formed between an incident direction of the incident light and the z-axis, $\Lambda$ indicates the lattice constant of the fine structure, and m indicates the diffraction order.

In the visible range, a wavelength of 700 nm, at which it is difficult to generate high-order diffraction light, is considered. When $\Lambda$ is set to a value equal to or larger than 1.0 µm, the second- or higher-order diffraction light may be generated, and hence the efficiency of light extraction to the outside may be improved.

When the incident angle of light entering the fine structure layer 105 from the light-emitting layer is larger than the critical angle in the interface between the front plate and the outside region, zero-order transmitted diffraction light is totally reflected in the interface between the front plate and the outside region.

In order to improve the efficiency of light extraction to the outside, it is necessary to increase transmitted diffraction light propagating at an angle smaller than an angle of the zero-order transmitted diffraction light and to reduce transmitted diffraction light propagating at a larger angle.

When $\Lambda$ becomes larger, a larger amount of the transmitted diffraction light of the diffraction order propagating at the angle larger than the angle of the zero-order transmitted diffraction light is generated. Therefore, a total reflection loss in the interface between the front plate and the outside region increases, and hence the efficiency of light extraction to the outside reduces.

Desirably, when $\Lambda$ is set to a value equal to or smaller than 3.0 µm, the total reflection loss may be reduced, and hence the efficiency of light extraction to the outside may be maintained at a high level.

That is, when the average distance between center of gravity of the fine structure layer 105 in the image display apparatus according to the present invention is set to a value equal to or larger than 1.0 µm and equal to or smaller than 3.0 µm, the second- or higher-order diffraction light may be generated and the total reflection loss may be reduced. The efficiency of light extraction to the outside may be further improved.

The efficiency of light extraction to the outside is improved, and hence the display luminance of the image display apparatus may be increased. Therefore, an image display apparatus having a high contrast may be obtained.

The case where the cylindrical structures are non-periodically arranged in the fine structure layer is described. However, the present invention is not limited to this case. Spherical structures may be arranged.

EXAMPLES

Hereinafter, examples of the present invention are described.

Example 1

In Example 1, a structural example of the fine structure included in the image display apparatus according to the present invention is described.

With respect to the fine structure in this example, each of the cylindrical structures of the fine structure layer 105 illustrated in FIGS. 2A and 2B is 800 nm in diameter 213 and 800 nm in height 214.

Figure 6:
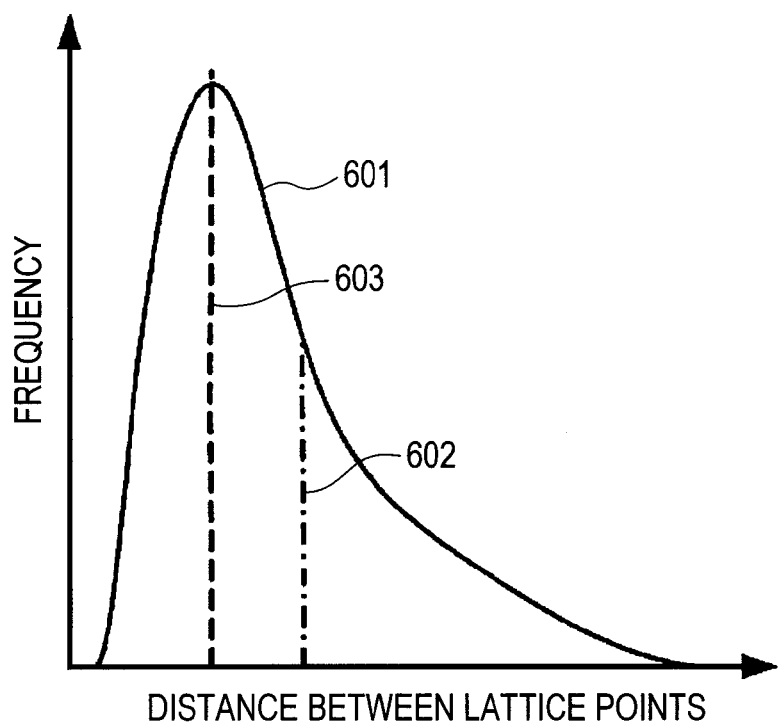
FIG. 6 illustrates a distance between center of gravity frequency distribution in an image display apparatus according to Example 1.

In this example, the fine structure layer 105 has a frequency distribution of a distance between center of gravity illustrated by a solid line 601 of FIG. 6 based on the assumption that L=2.6 µm, 6/L=0.26, and L/Lmax=1.2.

In this example, the fine structure layer 105 is provided to satisfy Expression 3 and Expression 6 and further satisfy "1.0 µm<L<3.0 µm".

In FIG. 6, a dashed line 602 exhibits the average distance between center of gravity L and a broken line 603 exhibits the most frequent distance between center of gravity Lmax. The refractive index of the first medium for the cylindrical structures is set to 2.2 and the refractive index of the second medium for the surrounding region (layer) 210 is set to 1.5.

The front plate 101 is made of a medium having a refractive index of 1.46. The light-emitting layer 104 is made of a medium having a refractive index of 1.3.

The excitation unit (not shown) is provided on a rear side of the light-emitting layer 104 and a region located on the rear side is in a vacuum.

Figure 7:
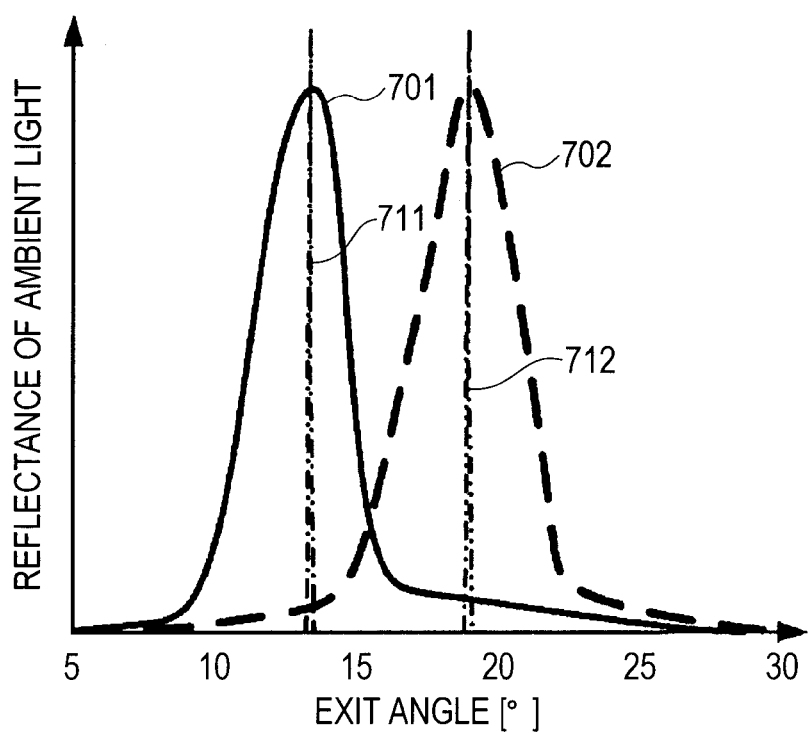
FIG. 7 illustrates reflected ambient light in the image display apparatus according to Example 1.

FIG. 7 illustrates a reflectance of ambient light in a case where light enters the image display apparatus 100 using the fine structure layer 105 described above in a direction perpendicular to the front plate 101 from the outside.

In FIG. 7, the abscissa indicates an angle formed between the reflected ambient light and the z-axis, and the ordinate indicates an intensity of the reflected ambient light.

FIG. 7 further illustrates a reflectance of ambient light entering an image display apparatus including a conventional fine structure for comparison.

With respect to the conventional fine structure, cylindrical structures made of the first medium are arranged at the periodically arranged lattice points.

In FIG. 7, a solid line 701 and a broken line 702 exhibit characteristics of the structure in this example to which the present invention is applied, and a dashed line 711 and a chain double-dashed line 712 exhibit characteristics of the conventional structure. The solid line 701 and the dashed line 711 exhibit the characteristics in a case where incident light has a wavelength of 450 nm. The broken line 702 and the chain double-dashed line 712 exhibit the characteristics in a case where the incident light has a wavelength of 650 nm.

As illustrated in FIG. 7, because the periodic lattice point arrangement is provided in the conventional structure, the angle distribution of the reflected ambient light is not wide.

This exhibits that, when the image display apparatus is used in an environment in which ambient light has multiple wavelengths, a reflection angle changes depending on wavelength, and hence the color breakup of a reflection image formed by the reflected ambient light occurs.

In contrast to this, in this example to which the present invention is applied, as illustrated in FIG. 7, there is an overlap range between two reflected ambient light beams having different wavelengths, and hence the color breakup of a reflection image formed by the reflected ambient light beams reduces. Therefore, an image display apparatus in which the influence of an ambient environment is reduced is obtained.

As described above, in the image display apparatus 100 according to this example, the fine structure layer 105 illustrated in FIGS. 2A and 2B is provided between the front plate 101 and the light-emitting layer 104. Therefore, the color breakup of the reflection image formed by the reflected ambient light beams reduces, and hence the image display apparatus in which the influence of the ambient environment may be reduced is obtained.

Figure 8A:
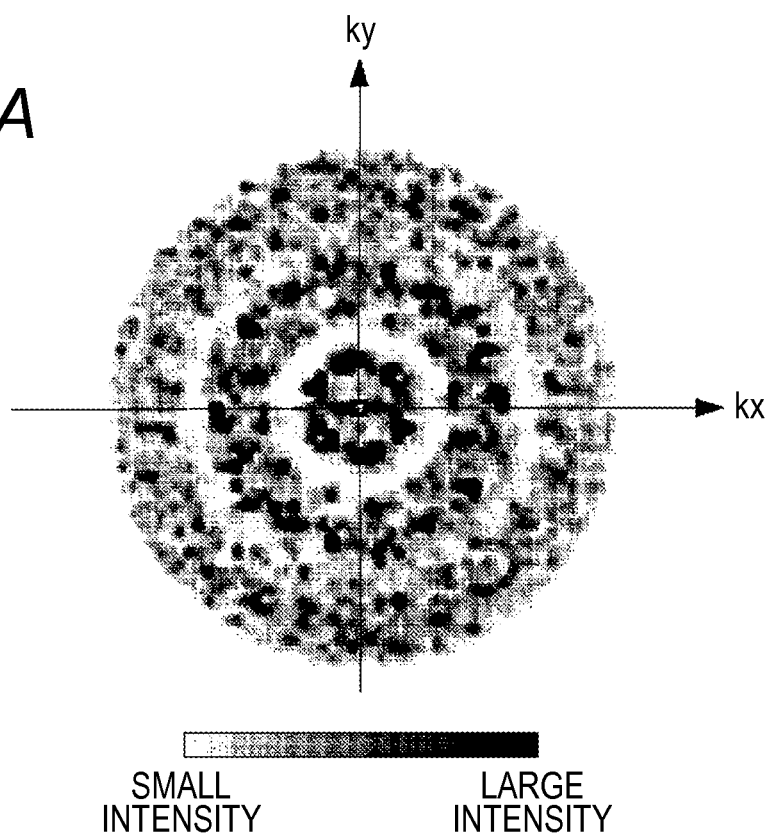
FIGS. 8A and 8B illustrate an orientation distribution in the image display apparatus according to Example 1.
Figure 8B:
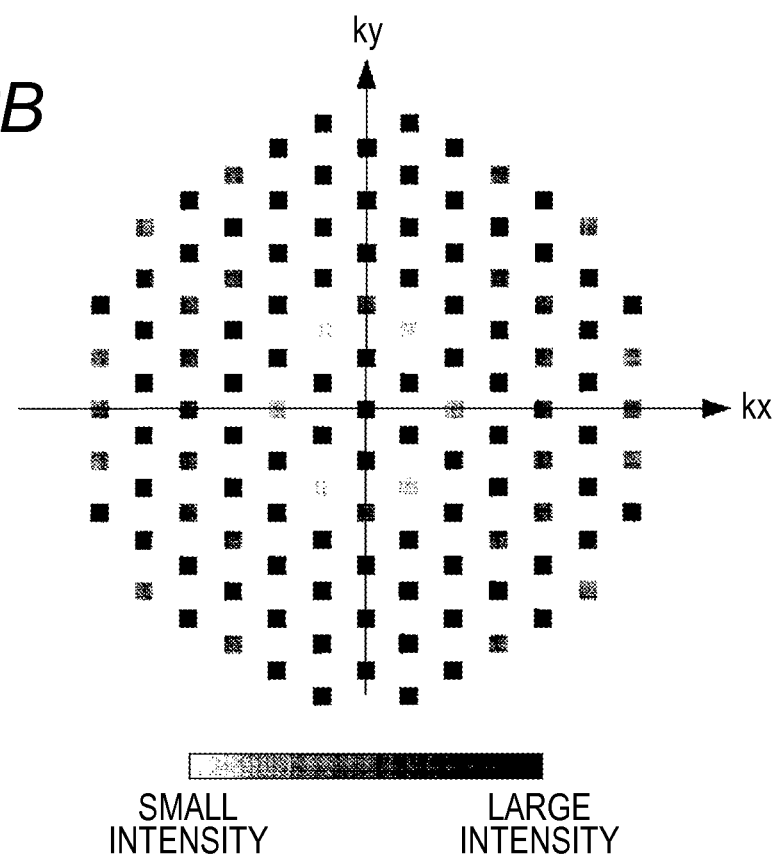

FIG. 8A illustrates an orientation distribution of transmitted light in a case where light vertically enters the fine structure layer 105 in this example. FIG. 8B illustrates an orientation distribution of transmitted light in a case where light vertically enters a fine structure including periodic triangular lattices formed at lattice points.

The fine structure layer 105 in this example has the non-periodic arrangement and thus includes triangular lattices with various directions and distances between center of gravity.

Therefore, the fine structure layer 105 in this example has a ring-shaped orientation distribution, to thereby reduce azimuth angle dependence.

When the fine structure layer 105 in this example is used, an image display apparatus may be obtained in which the orientation unevenness of display light is reduced as compared with the case where the fine structure including the periodic triangular lattices is used. The fine structure satisfying Expression 3 and Expression 6 is used in the image display apparatus according to this example. Thus, the image display apparatus is obtained in which the high contrast is realized and the color breakup of the reflection image formed by the reflected ambient light is reduced.

When "1.0 µm<L<3.0 µm" is satisfied, an image display apparatus having a higher contrast is obtained.

In this example, it is desired that the average distance between center of gravity, the most frequent distance between center of gravity, and the variation of distance between center of gravity be derived from a region capable of reducing the color breakup of the reflection image viewed by a viewer of the image display apparatus.

For example, the average distance between center of gravity, the most frequent distance between center of gravity, and the variation of distance between center of gravity are derived for each region having an area of 0.1 m×0.1 m in the image display apparatus.

In another example, the average distance between center of gravity, the most frequent distance between center of gravity, and the variation of distance between center of gravity are derived for each pixel of the image display apparatus.

The effects of the present invention are not lost even when the first medium and the second medium for the fine structure layer 105 in this example are mediums different in refractive index from the mediums described in this example as long as there is a phase difference between the light propagating through the first medium and the light propagating through the second medium.

It is desired that the refractive index difference between the first medium and the second medium be large. In this case, even when the height of the cylindrical structure 211 is low, sufficient diffraction efficiency may be obtained, and hence light extracted to the outside may be increased.

In this example, the fine structure layer 105 is provided between the light-emitting layer 104 and the front plate 101.

As long as the ambient light 107 enters the fine structure layer 105 in this example, even when the fine structure layer 105 is provided between the light-emitting layer 104 and the outside region or provided on the rear side of the light-emitting layer 104, the effects of the present invention are not lost.

It is more desired that the fine structure be provided between the light-emitting layer and the outside region so as to receive ambient light having a higher intensity, to thereby obtain a higher effect of reducing the color breakup of the reflection image formed by the reflected ambient light.

When the fine structure is provided between the light-emitting layer and the front plate, higher light extraction efficiency may be obtained.

Next, an image display apparatus according to this example is described with reference to FIG. 13.

Figure 13:
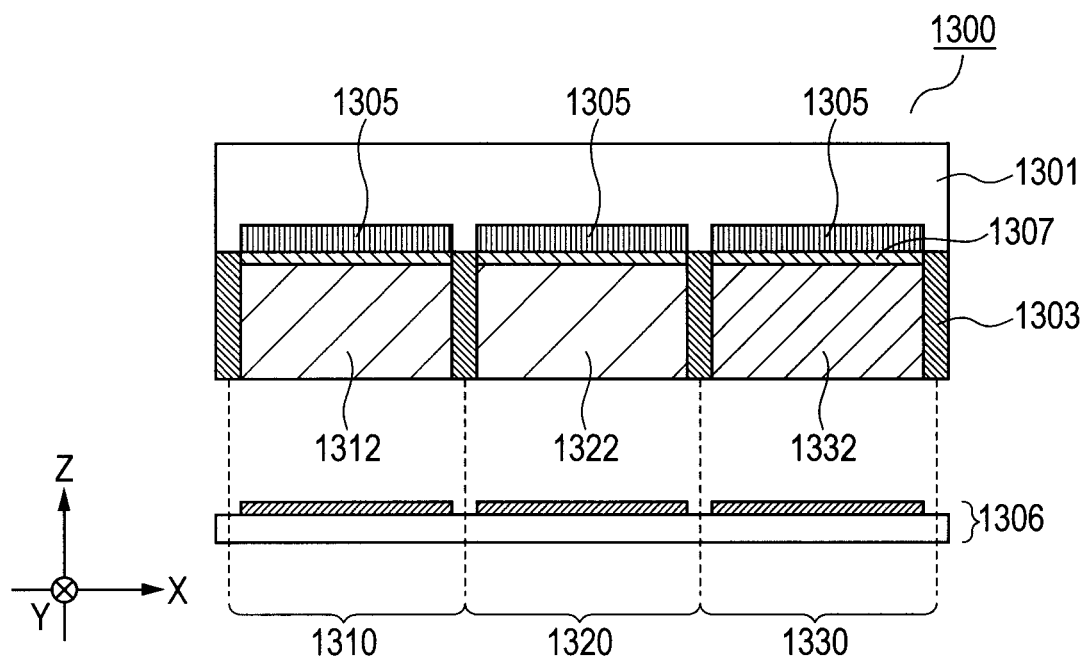
FIG. 13 illustrates an image display apparatus according to Example 1.
Figure 14:
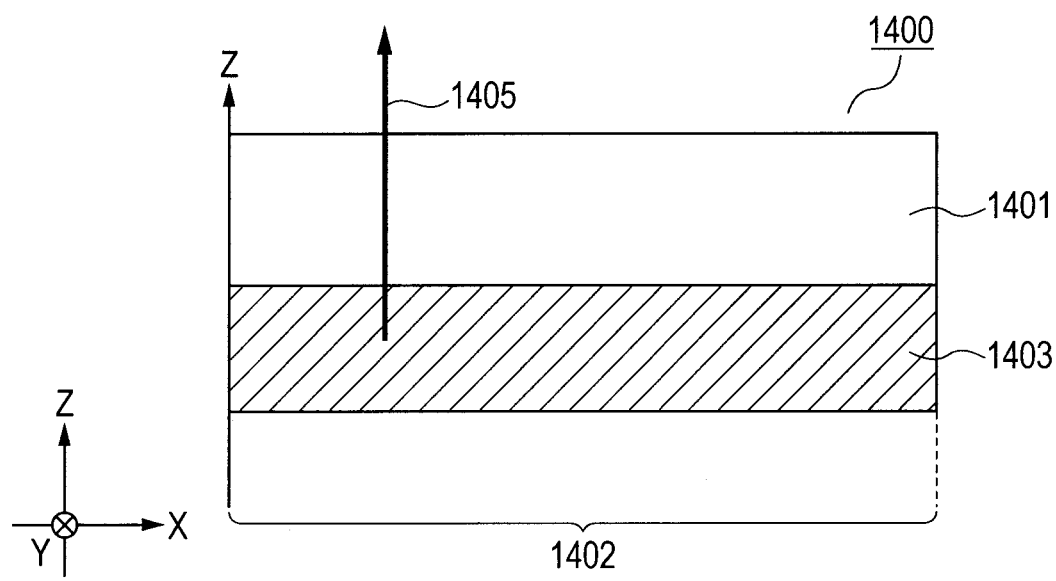
FIG. 14 illustrates a conventional example for comparison with the present invention.
Figure 15:
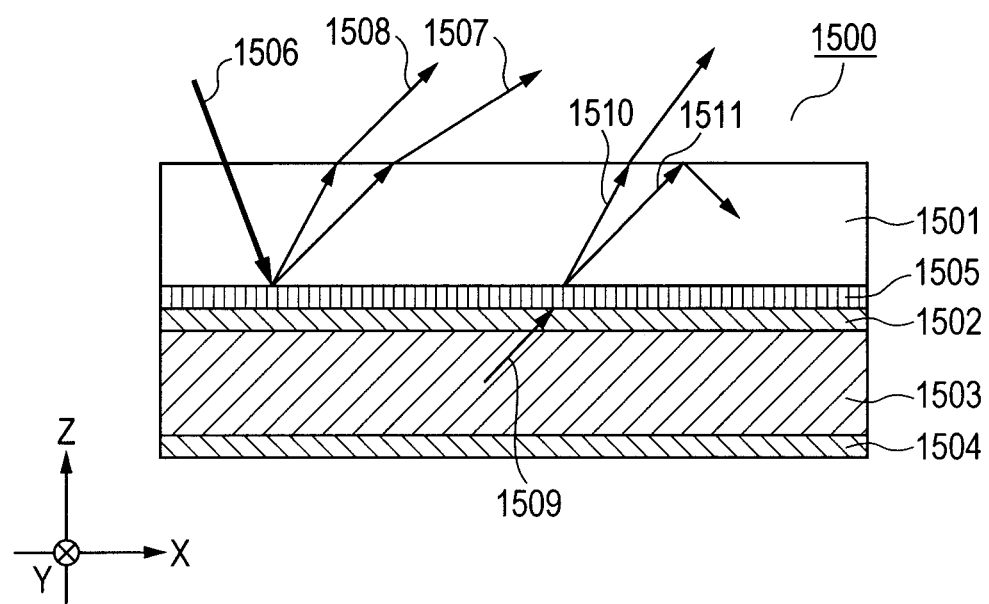
FIG. 15 illustrates an image display apparatus described in PTL 1 as the conventional example for comparison with the present invention.

FIG. 13 is an xy-cross sectional view illustrating an image display apparatus 1300 in which multiple pixels 1310, 1320, and 1330 are arranged in a plane parallel to a front plate 1301.

The image display apparatus 1300 includes the pixels 1310, 1320, and 1330 for displaying respective colors of red, green, and blue. The pixels 1310, 1320, and 1330 are provided on a rear surface of the front plate 1301.

The respective pixels are separated by a portion 1303 made of a medium having a light absorption property.

FIG. 13 illustrates the three pixels 1310, 1320, and 1330, and the multiple pixels are arranged to constitute the image display apparatus 1300. The front plate 1301 is made of a medium transparent to visible light. For example, glass may be used.

The pixels 1310, 1320, and 1330 include light-emitting layers 1312, 1322, and 1332, fine structures 1305, and excitation units 1306 and 1307, respectively.

The fine structures 1305 are provided on front surfaces of the light-emitting layers 1312, 1322, and 1332. The excitation unit 1307 is provided between the light-emitting layers 1312, 1322, and 1332 and the front plate 1301.

The excitation unit 1306 is provided on rear surfaces of the light-emitting layers 1312, 1322, and 1332.

The light-emitting layers 1312, 1322, and 1332 of the pixels include fluorescent substances which emit light having wavelengths of red, green, and blue, respectively.

Each of the fine structures 1305 includes: the cylindrical structure made of the first medium; and the second medium which is provided around the cylindrical structure and different in refractive index from the first medium. Each of the fine structures 1305 is provided to satisfy Expression 3 and Expression 6 and further satisfy "1.0 µm<L<3.0 µm".

The excitation units 1306 and 1307 are layers including portions for injecting electrons into the light-emitting layers 1312, 1322, and 1332. For example, the excitation units 1306 and 1307 have structures in which electron emitting elements and electrodes are provided on a substrate and transparent electrodes are provided on surfaces of the light emitting elements.

In such structures, when electric fields are applied to the electron emitting elements, electrons are emitted to the light-emitting layers. Therefore, the light-emitting layers 1312, 1322, and 1332 emit light beams upon reception of electrons.

The generated light beams pass through the fine structures 1305 and the front plate 1301 and are extracted to the outside to become display light.

The fine structures 1305 in the image display apparatus 1300 according to this example satisfy Expression 3 and Expression 6, and hence the image display apparatus in which the color breakup of the reflection image formed by the reflected ambient light is reduced is obtained.

The fine structures 1305 satisfy "1.0 µm<L<3.0 µm", and hence the image display apparatus having the higher contrast is obtained.

Even when the fine structures 1305 having the same medium and structure are used for the respective pixels 1310, 1320, and 1330 in the image display apparatus 1300 according to this example, an image display apparatus in which a variation in display luminance of each of the pixels is small may be obtained. Light beams entering the fine structures 1305 in various directions are distributed as a large number of diffraction light beams.

Intensities of the diffraction light beams are small and variations in intensities due to changes in wavelengths of the incident light beams are also small. The display light is a sum of a large number of transmitted diffraction light beams produced from the light beams entering the fine structures 1305 in various directions. Therefore, even when the wavelengths of the light beams entering the fine structures 1305 vary, a variation in intensity of the display light is small, and hence a characteristic in which a display light intensity difference is small in each of the pixels may be obtained. Thus, the structures to be provided do not necessarily depend on pixel, and hence the image display apparatus is easily manufactured.

In the image display apparatus 1300 according to this example, the fine structures 1305 included in the respective pixels may be different from one another.

Alternatively, a fine structure provided in any one of the pixels 1310, 1320, and 1330 corresponding to red, green, and blue may be different from fine structures provided in the other pixels.

Therefore, an image display apparatus may be obtained in which a display light enhancement effect is further improved and a higher contrast is realized as compared with the case where the same fine structure is provided for each of the pixels. The fine structures provided in the respective pixels may have different thicknesses in yz-cross section from one another. Alternatively, the average distance between center of gravity and constituting mediums of the fine structures may be varied among the pixels.

In the image display apparatus 1300 according to this example, the fine structures 1305 are provided between the light-emitting layers 1312, 1322, and 1332 and the front plate 1301. As long as the ambient light and the light beams generated in the light-emitting layers enter the fine structures 1305, the positions of the fine structures are not limited.

In this example, the transparent electrodes (excitation units) 1307 are provided on the surfaces of the light-emitting layers. Even when the transparent electrodes are provided on rear surfaces of the light-emitting layers, the effects of the present invention are not lost.

The excitation units described in this example may be layers for injecting electrons and holes into the light-emitting layers 1312, 1322, and 1332.

In such a case, the light-emitting layers are made of a material containing an organic compound or an inorganic compound.

The excitation units 1306 and 1307 may be provided such that an anode is provided between each of the light-emitting layers and the front plate and a cathode is provided on each of the rear surfaces of the light-emitting layers so as to bring each of the light-emitting layers adjacent to the anode and the cathode. In such a structure, a current is caused to flow between the anode and the cathode to inject electrons and holes into each of the light-emitting layers, to thereby generate light in each of the light-emitting layers.

Example 2

In Example 2, a method of manufacturing the fine structure layer 105 of Example 1 at a low cost is described with reference to FIGS. 11A to 11E.

Figure 11A:
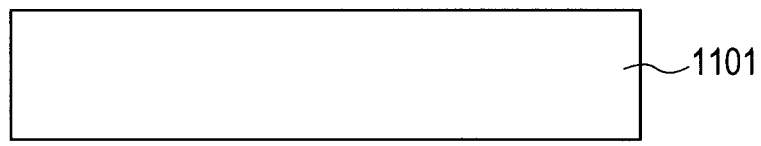
FIGS. 11A, 11B, 11C, 11D and 11E illustrate a method of manufacturing fine structures arranged in an image display apparatus according to Example 2.
Figure 11B:
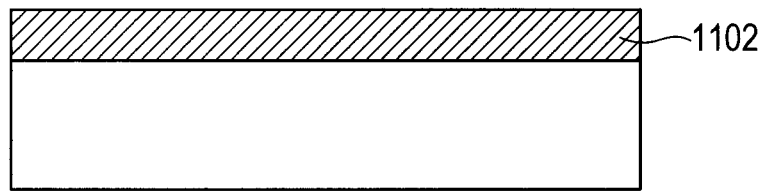

A layer 1102 made of the first medium is formed on a front plate 1101 illustrated in FIG. 11A by, for example, sputtering or spin coating (FIG. 11B).

Figure 11C:
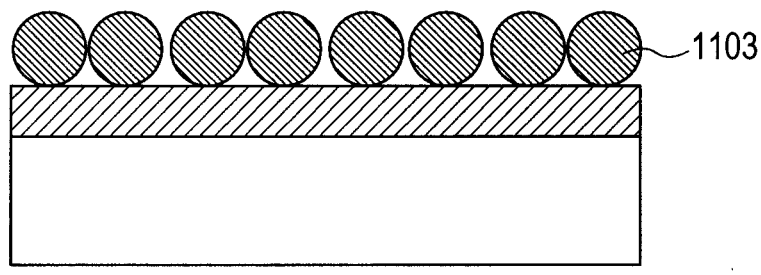

After that, a bonding layer (not shown) is formed on the layer 1102, minute balls 1103 are arranged, and excessive minute balls are removed (FIG. 11C).

In this case, a radius and a packing factor of the minute balls 1103 are adjusted to control the average distance between center of gravity, the most frequent distance between center of gravity, and the variation of distance between center of gravity.

After the arrangement of the minute balls, isotropic etching, for example, wet etching is performed to reduce the size of the minute balls 1103 and remove the bonding layer.

Figure 11D:
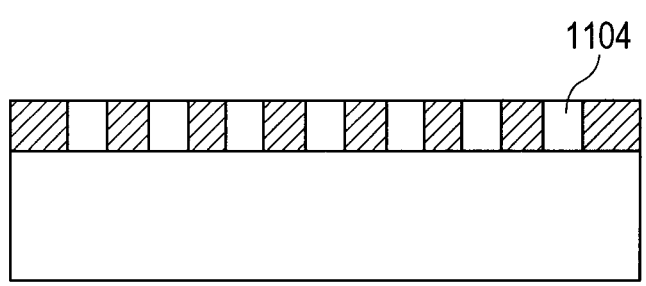

After that, anisotropic etching, for example, reactive ion etching using the minute balls 1103 as a mask is performed to form circular holes 1104 (FIG. 11D).

Figure 11E:
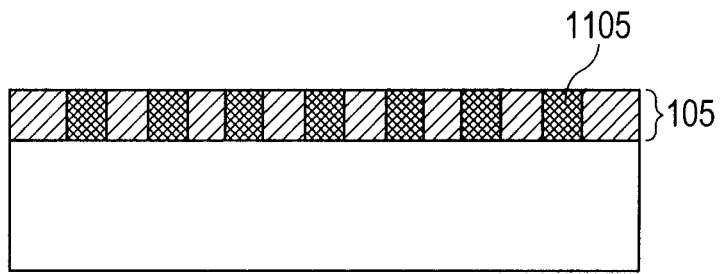

The circular holes 1104 are filled by, for example, sputtering or spin coating to form cylindrical structures 1105 (FIG. 11E).

When the manufacturing method described above is used, the fine structure layer 105 including the cylindrical structures 1105 may be formed. Then, when the pixel structures including the transparent electrodes and the light-emitting layers are formed, the image display apparatus 100 may be obtained.

In the manufacturing method illustrated in FIGS. 11A to 11E, the fine structure layer 105 is formed using the minute ball arrangement as the mask. Because the minute ball arrangement is used as the mask, the fine structure layer 105 in which the centers of gravity of the cylindrical structures are non-periodically arranged may be formed in a large area at a low cost.

Next, a method of manufacturing the fine structure layer 105 of this example at a lower cost is further described with reference to FIGS. 12A to 12C.

Figure 12A:
FIGS. 12A, 12B and 12C illustrate a method of manufacturing fine structures arranged in the image display apparatus according to Example 2.

A bonding layer (not shown) is applied onto the front plate 1101 illustrated in FIG. 12A. After that, minute balls 1106 made of the second medium are arranged and excessive minute balls are removed (FIG. 12B).

In this case, a radius and a packing factor of the minute balls 1106 are adjusted to control the average distance between center of gravity, the most frequent distance between center of gravity, and the variation of distance between center of gravity.

After the arrangement of the minute balls, isotropic etching, for example, wet etching is performed to reduce the size of the minute balls 1106 and remove the bonding layer. After that, the first medium is filled around the minute balls to form the fine structure layer 105 including the minute ball structures 1108 and a surrounding region 1107 (FIG. 12C).

For example, spin coating or sputtering may be used for the filling of the first medium.

Examples of the first medium which may be used include a low-refractive index material (spin-on-glass material) and a high-refractive index material ($TiO_2$). Examples of the second medium which may be used include a low-refractive index material ($SiO_2$) and a high-refractive index material ($TiO_2$).

In order to improve the efficiency of light extraction to the outside, it is desired that the refractive index difference between the first medium and the second medium be large. It is also desired that the refractive index of the first medium be lower than the refractive index of the second medium.

Then, the pixel structures including the transparent electrodes and the light-emitting layers are formed to obtain the image display apparatus 100.

Figure 12B:
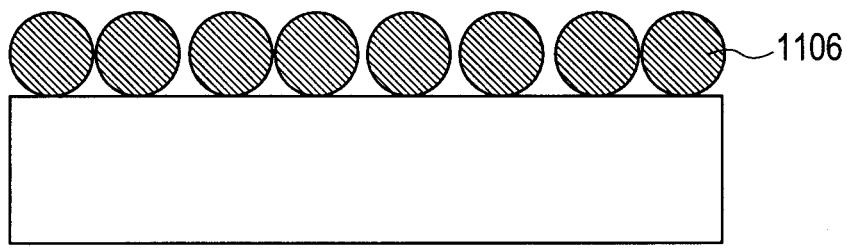
Figure 12C:
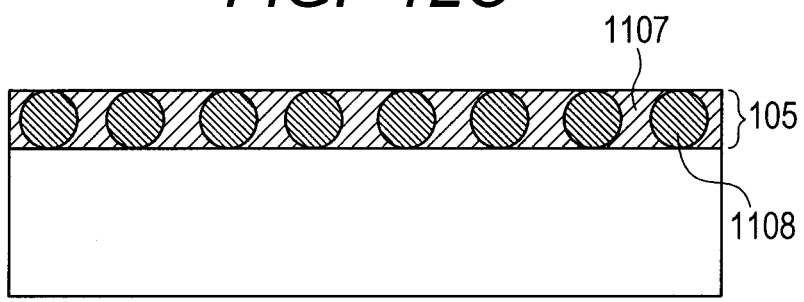

In the manufacturing method illustrated in FIGS. 12A to 12C, the refractive index distribution of the fine structure layer 105 is produced by the minute ball arrangement.

When the minute ball arrangement is employed, the fine structure layer 105 provided in the image display apparatus according to the present invention may be manufactured with a smaller number of steps, and hence the image display apparatus may be obtained at a lower cost. In this example, the fine structure layer provided in the image display apparatus includes the cylindrical structures or the ball structures, to thereby produce the image display apparatus at a lower cost.

In this example, after the arrangement of the minute balls, isotropic etching is performed to reduce the size of the minute balls 1106, to thereby form the fine structure layer 105 having a desired cylindrical diameter or ball diameter. The step of reducing the side of the minute balls may be omitted.

In such a case, the minute balls 1103 (or minute balls 1106) are arranged so that the diameter thereof is substantially equal to the diameter of the cylindrical structures 1105 (or minute ball structures 1108). After that, in the case illustrated in FIGS. 11A to 11E, anisotropic etching is performed using the arranged minute balls 1103 as the mask, and the circular holes 1104 is filled to form the fine structure layer 105. In the case illustrated in FIGS. 12A to 12C, the first medium is filled around the minute balls 1106 to form the fine structure layer 105. There is a relationship between a minute ball number density P [$1/m^2$] and an average distance between center of gravity L of the minute balls 1103 (or minute balls 1106), which is expressed by the following expression.

$$L = \sqrt{\frac{2}{P\sqrt{3}}}$$

Therefore, when the number density P is adjusted to satisfy the following expression, the average distance between center of gravity may be controlled.

$$\frac{2}{9\sqrt{3}}10^{12} < P < \frac{2}{\sqrt{3}}10^{12}$$

For example, the minute balls 1103 which are 730 nm in radius are dispersed at a number density of $3e^{11}$ [$1/m^2$] to form a fine particle layer.

Then, the substrate is etched using the minute balls as an etching mask to form the fine structure layer 105 in which the packing factor of the cylindrical structures 1105 is 0.5, L is 2 [μm], and σ/L is 0.23.

The minute balls which are substantially equal in radius to the cylindrical structures 1105 (or minute ball structures 1108) are arranged as described above, and hence the fine structure layer 105 in which the centers of gravity of the cylindrical structures (or minute ball structures) are non-periodically arranged may be formed in a large area at a low cost.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-091594, filed Apr. 12, 2010, which is hereby incorporated by reference herein in its entirety.

The invention claimed is:

1. An image display apparatus, comprising multiple light emitting elements,
   wherein each of the light emitting elements includes:
   (a) a light-emitting layer; and
   (b) a layer having a plurality of first mediums and a second medium having a refractive index different from a refractive index of the first medium, for extracting light generated from the light-emitting layer,
   wherein the first mediums are non-periodically arranged in the second medium, and
   wherein the first mediums are arranged so as to satisfy the following relational expression:

$$0.10 < \frac{\sigma/L}{1 + (1 - (\sigma/L)^2)(L/L_{max} - 1)}$$

where L is an average distance between centers of gravity of the first medium, Lmax is a most frequent distance between the centers, and σ is a variation of distance between centers.

2. The image display apparatus according to claim 1, wherein the first mediums are arranged so as to satisfy the following relational expression:

$$0.27 < \frac{\sigma/L}{1 + (1 - (\sigma/L)^2)(L/L_{max} - 1)}.$$

3. The image display apparatus according to claim 1, wherein the first mediums are arranged so as to satisfy the following relational expression:

$$\frac{\sigma/L}{1 + (1 - (\sigma/L)^2)(L/L_{max} - 1)} < 0.83.$$

4. The image display apparatus according to claim 1, wherein the first mediums are arranged so as to satisfy the following relational expression:

$$\frac{\sigma/L}{1 + (1 - (\sigma/L)^2)(L/L_{max} - 1)} < 0.58.$$

5. The image display apparatus according to claim 1, wherein the first mediums are arranged so as to satisfy the following relational expression:

$$1.0 \,\mu m < L < 3.0 \,\mu m.$$

6. The image display apparatus according to claim 1, wherein the layer having the plurality of first mediums and the second medium is provided closer to a light exit side than the light-emitting layer.

7. The image display apparatus according to claim 6, further comprising a front plate transmitting the light generated from the light-emitting layer,
   wherein the front plate is provided closer to the light exit side than the layer having the plurality of first mediums and the second medium.

8. The image display apparatus according to claim 1, wherein the first medium comprises a cylindrical structure.

9. The image display apparatus according to claim 1, wherein the first medium comprises a spherical structure.

10. A method of manufacturing the image display apparatus according to claim 1, comprising dispersing minute balls on a substrate at a number density $P(1/m^2)$ to form a fine particle layer,
    wherein the number density P satisfies the following relational expression:

$$\frac{2}{9\sqrt{3}} 10^{12} < P < \frac{2}{\sqrt{3}} 10^{12}.$$

11. The method according to claim 10, further comprising etching the substrate using the fine particle layer as an etching mask to form the layer having the plurality of first mediums and the second medium.

* * * * *